(12) United States Patent
Loscutoff et al.

(10) Patent No.: US 9,564,551 B2
(45) Date of Patent: Feb. 7, 2017

(54) METHOD OF MANUFACTURING A HYBRID EMITTER ALL BACK CONTACT SOLAR CELL

(71) Applicant: SunPower Corporation, San Jose, CA (US)

(72) Inventors: Paul Loscutoff, Castro Valley, CA (US); Seung Rim, Palo Alto, CA (US)

(73) Assignee: SunPower Corporation, San Jose, CA (US)

(*) Notice: Subject to any disclaimer, the term of this patent is extended or adjusted under 35 U.S.C. 154(b) by 12 days.

(21) Appl. No.: 15/067,960

(22) Filed: Mar. 11, 2016

(65) Prior Publication Data

US 2016/0204288 A1     Jul. 14, 2016

Related U.S. Application Data

(62) Division of application No. 13/720,721, filed on Dec. 19, 2012, now Pat. No. 9,312,406.

(51) Int. Cl.
| | |
|---|---|
| *H01L 21/00* | (2006.01) |
| *H01L 31/18* | (2006.01) |
| *H01L 31/0224* | (2006.01) |
| *H01L 31/0368* | (2006.01) |

(52) U.S. Cl.
CPC ..... *H01L 31/182* (2013.01); *H01L 31/022458* (2013.01); *H01L 31/03682* (2013.01); *H01L 31/18* (2013.01); *H01L 31/1804* (2013.01); *Y02E 10/50* (2013.01); *Y02E 10/546* (2013.01); *Y02E 10/547* (2013.01)

(58) Field of Classification Search
CPC .... H01L 31/18; H01L 31/1804; H01L 31/182; Y02E 10/50; Y02E 10/546; Y02E 10/547
USPC .............................................. 438/57, 97, 98
See application file for complete search history.

(56) References Cited

U.S. PATENT DOCUMENTS

| | | | |
|---|---|---|---|
| 9,130,092 B1* | 9/2015 | Nielson | ........... H01L 31/022441 |
| 9,252,301 B2 | 2/2016 | Morigami et al. | |
| 9,257,593 B2 | 2/2016 | Hashiguchi et al. | |
| 2009/0223562 A1* | 9/2009 | Niira | .................. H01L 31/1804 |
| | | | 136/256 |

* cited by examiner

*Primary Examiner* — Lindsey Bernier
(74) *Attorney, Agent, or Firm* — Okamoto & Benedicto LLP

(57) ABSTRACT

A method of manufacturing an all back contact solar cell which has a hybrid emitter design. The solar cell has a thin dielectric layer formed on a backside surface of a single crystalline silicon substrate. One emitter of the solar cell is made of doped polycrystalline silicon that is formed on the thin dielectric layer. A second emitter of the solar cell is formed in the single crystalline silicon substrate and is made of doped single crystalline silicon. The method further includes forming contact holes that allow metal contacts to connect to corresponding emitters.

10 Claims, 6 Drawing Sheets

METHOD OF MANUFACTURING A HYBRID EMITTER ALL BACK CONTACT SOLAR CELL

CROSS-REFERENCE TO RELATED APPLICATION

This application is a divisional of U.S. patent application Ser. No. 13/720,721, filed on Dec. 19, 2012, now U.S. Pat. No. 9,312,406, which is incorporated herein by reference in its entirety.

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. In an all back contact solar cell, all metal contacts and corresponding emitters are formed on the backside of the solar cell. An external electrical circuit, e.g., a load, may be connected to the metal contacts to be powered by the solar cell.

To remain a commercially-viable renewable energy source, solar cells need to be manufactured at low cost. Embodiments of the present invention pertain to a hybrid emitter design that simplifies the manufacture of solar cells while retaining efficiency.

BRIEF SUMMARY

In one embodiment, an all back contact solar cell has a hybrid emitter design. The solar cell may have a thin dielectric layer formed on a backside surface of a single crystalline silicon substrate. The thin dielectric layer may comprise silicon dioxide that is formed directly on the backside surface of the single crystalline silicon substrate. One emitter of the solar cell may comprise doped polycrystalline silicon that is formed on the thin dielectric layer. The other emitter of the solar cell may be formed in the single crystalline silicon substrate and comprise doped single crystalline silicon. The solar cell includes contact holes that allow metal contacts to connect to corresponding emitters.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of apparatus, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

FIGS. 1-12 show cross-sections that schematically illustrate a method of manufacturing a solar cell in accordance with an embodiment of the present invention. FIGS. 1-12 are not drawn to scale.

Figure 1:
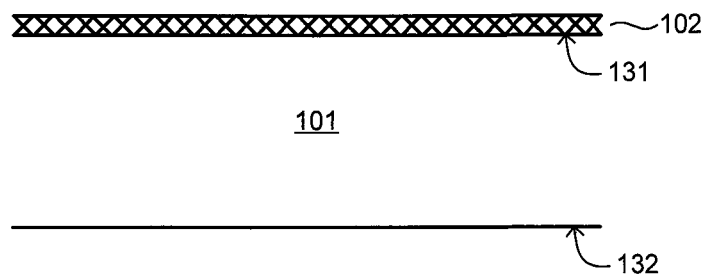
FIGS. 1-12 show cross-sections that schematically illustrate a method of manufacturing a solar cell in accordance with an embodiment of the present invention.

In FIG. 1, a thin dielectric layer 102 is formed on a single crystalline silicon substrate 101. The substrate 101 may comprise a high-lifetime N-type single crystalline silicon wafer. In one embodiment, the thin dielectric layer 102 comprises silicon dioxide formed directly on a backside surface 131 of the single crystalline silicon substrate 101. The backside surface 131 is opposite a front side surface 132 of the single crystalline silicon substrate 101. The front side surface 132 is on the front side of the solar cell, which is also referred to as the "sun side" because it faces the sun during normal operation. The backside surface 131 is on the backside of the solar cell. The solar cell being manufactured is an all back contact solar cell in that the emitters and corresponding metal contacts are all formed on the backside of the solar cell.

The thin dielectric layer 102 may provide a tunneling function, e.g., as a tunnel oxide. In one embodiment, the thin dielectric layer 102 comprises silicon dioxide thermally grown directly on the backside surface 131 to a thickness less than or equal to 40 Angstroms (e.g., between 5 to 40 Angstroms, preferably 20 Angstroms).

Figure 2:
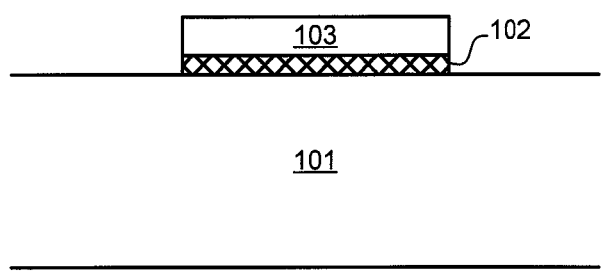

In FIG. 2, a plurality of doped polycrystalline silicon emitters 103 are formed on the thin dielectric layer 102. Only one polycrystalline silicon emitter 103 is shown in the figures for clarity of illustration. The polycrystalline silicon emitter 103 may be deposited doped or doped after deposition. In the example of FIG. 2, the polycrystalline silicon emitter 103 is doped with a P-type dopant, such as boron. As can be appreciated, the polycrystalline silicon emitter 103 may also be doped with an N-type dopant with appropriate changes to the doping of other emitters and/or the single crystalline silicon substrate 101. In the example of FIG. 2, portions of the thin dielectric layer 102 that are not under the polycrystalline silicon emitter 103 may be removed, e.g., by wet or dry etching.

As will be more apparent below, the solar cell being manufactured only has one polarity (P-type in this example) of polycrystalline silicon emitters; the opposite polarity emitters are single crystalline silicon emitter. This advantageously allows the polycrystalline silicon emitter 103 to be doped in situ.

Figure 9:
Figure 10:

A polycrystalline silicon emitter 103 may be formed by forming a layer of polycrystalline silicon layer 201 on the thin dielectric layer 102 as shown in FIG. 9. The polycrystalline silicon layer 201 may be formed by a deposition process, e.g., by low pressure chemical vapor deposition (LPCVD), to a thickness of around 1000 Angstroms to 5000 Angstroms, for example. A patterning step, such as masking and etching, follows to pattern the polycrystalline silicon layer 201 as shown in FIG. 10. In the example of FIG. 10, the thin dielectric layer 102 is patterned during patterning of the thin dielectric layer 102. The patterned polycrystalline silicon layer 201 serves as the polycrystalline silicon emitter 103. The polycrystalline silicon layer 201 may be doped before or after the patterning step.

Figure 11:
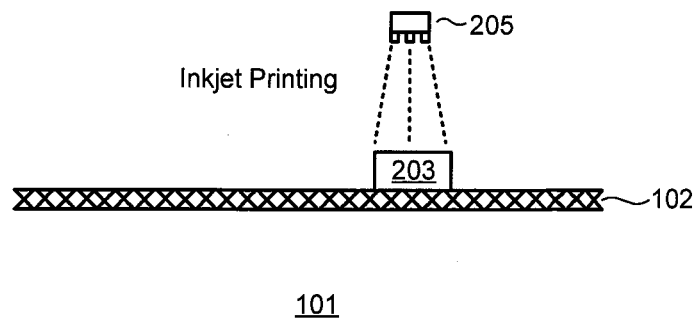
Figure 12:
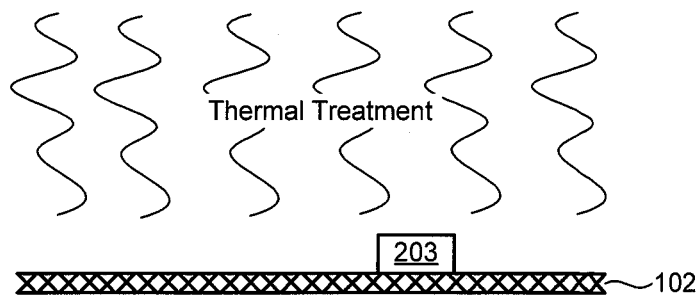

The polycrystalline silicon emitter 103 may also be formed using other processing steps, including by printing as shown in FIG. 11. In the example of FIG. 11, an emitter 203 is selectively printed by a print head 205 of an inkjet printer. The emitter 203 may comprise silicon nanoparticles that are inkjet printed on the thin dielectric layer 102. The emitter 203 may be doped before or after the printing step. A thermal treatment step coalesces the silicon nanoparticles to form polycrystalline silicon, which serves as the polycrystalline silicon emitter 103. The thin dielectric layer 102 does not have to be etched because dopants for forming the single crystalline silicon emitter in the single crystalline silicon 101 may be diffused through the thin dielectric layer 102, advantageously removing a patterning step.

Figure 3:
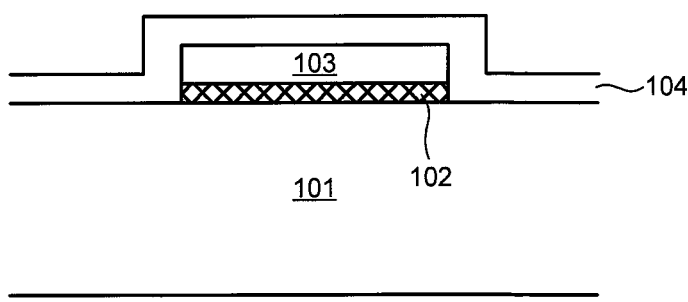

Continuing in FIG. 3, following formation of the polycrystalline silicon emitter 103, a dopant source layer 104 is formed on the polycrystalline silicon emitter 103 and the single crystalline silicon substrate 101. In the example of FIG. 3, the dopant source layer 104 comprises N-type dopants, such as phosphorus, to subsequently form an N-type emitter in the single crystalline silicon substrate 101. The dopants of the dopant source layer 104 may be changed (e.g., to P-type) to accommodate different dopant polarity requirements. In one embodiment, the dopant source layer 104 comprises a blanket layer of phosphorus-silicate-glass (PSG) formed to a thickness of about 1000 Angstroms by atmospheric pressure chemical vapor deposition (APCVD), for example.

Figure 4:
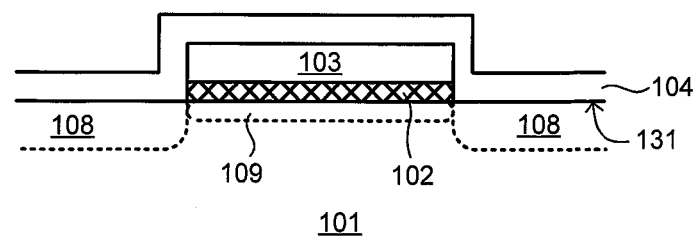

In FIG. 4, a diffusion step is performed to diffuse dopants from the dopant source layer 104 to the single crystalline silicon substrate 101 to form single crystalline silicon emitters 108. In the example of FIG. 4, because the dopant source layer 104 comprises N-type dopants, the resulting emitters 108 comprise N-type doped single crystalline silicon. The diffusion step may be performed by thermal processing in a diffusion furnace, for example. During the diffusion step, some amount of dopants from the polycrystalline silicon emitter 103 may diffuse through the thin dielectric layer 102 to form a doped region 109 in the single crystalline silicon substrate 101. In the example of FIG. 4, the doped region 109 is a P-type doped region because the polycrystalline silicon emitter 103 is doped with a P-type dopant.

To take advantage of the low charge carrier recombination under a polysilicon emitter 103, a polycrystalline silicon emitter 103 may cover more area of the back surface 131 of the single crystalline silicon substrate 101 compared to a single crystalline silicon emitter 108. For example, the polycrystalline silicon emitters 103 may have a total area that covers at least 80% of the total area of the back surface 131.

Figure 5:
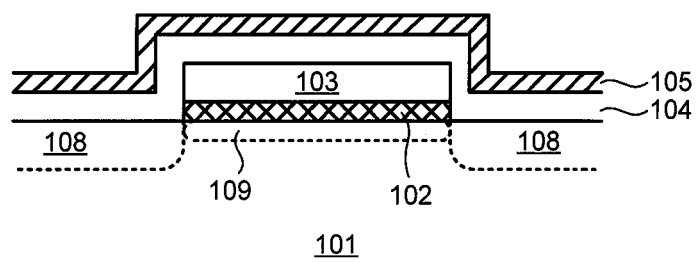

In FIG. 5, a material stack 105 is formed on the dopant source layer 104. The material stack 105 may comprise one or more layers of materials, such as moisture barrier, anti-reflective coating, and other materials depending on the particulars of the manufacturing process. The material stack 105 may be formed before or after the diffusion step.

Figure 6:
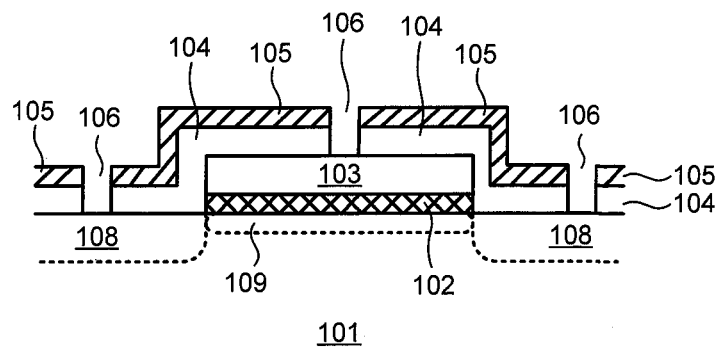

In FIG. 6, contact holes 106 are formed to expose the single crystalline silicon emitters 108 and polycrystalline silicon emitters 103. Generally, there are a plurality of emitters 108 and 103 in the solar cell and each is connected to a corresponding metal contact through a corresponding contact hole 106. In the example of FIG. 6, to expose underlying emitters 103, contact holes 106 are formed through the stack of materials 105 and dopant source layer 104, but not through the thin dielectric layer 102. Also in the example of FIG. 6, to expose underlying emitters 108, contact holes 106 are formed through the stack of materials 105 and the dopant source layer 104. When portions of the thin dielectric 102 are left over the emitters 108 (e.g., as in the example of FIG. 12), corresponding holes 106 are also formed through the thin dielectric layer 102 to expose underlying emitters 108. The contact holes 106 may be formed by laser ablation, mask and etch, or other processing step.

Figure 7:
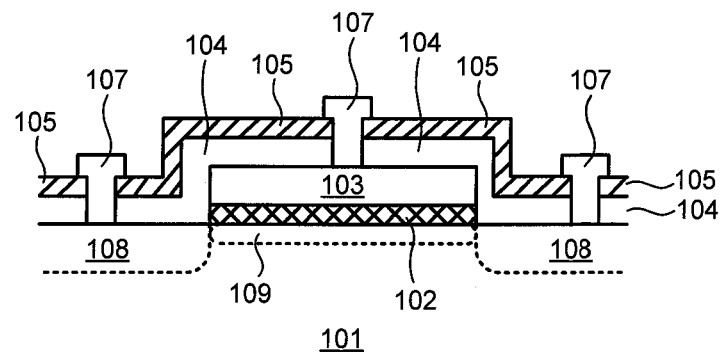

In FIG. 7, metal contacts 107 are formed in the contact holes 106 to connect to corresponding emitters. A metal contact 107 may comprise a single layer or multilayer metal contact. For example, a metal contact 107 may comprise aluminum formed on an emitter (e.g., emitter 103 or 108), a diffusion barrier comprising titanium-tungsten formed on the aluminum, and a seed layer comprising copper formed on the diffusion barrier.

In the example of FIG. 7, a metal contact 107 connected to a single crystalline silicon emitter 108 is an N-polarity metal contact in that it is connected to an N-type doped emitter 108. Similarly, a metal contact 107 connected to a polycrystalline silicon emitter 103 is a P-polarity metal contact in that it is connected to a P-type doped emitter 103. N-polarity metal contacts are connected together and electrically insulated from P-polarity metal contacts, which are also connected together. N-polarity metal contacts may be interdigitated with P-polarity metal contacts.

Figure 8:
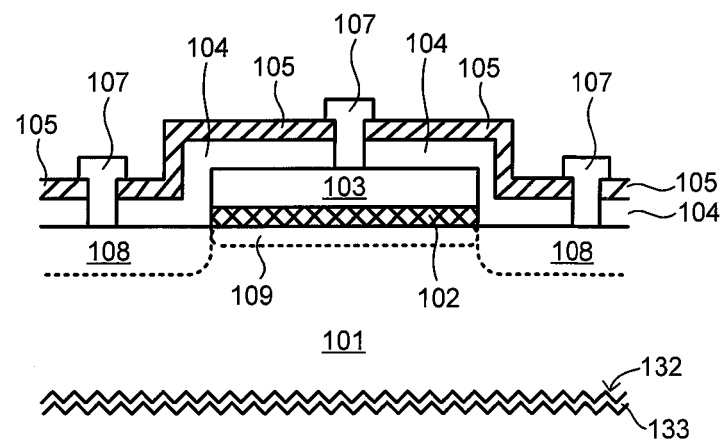

The manufacture of the solar cell may also incorporate additional processing steps. As shown in FIG. 8, the front side surface 132 of the single crystalline silicon substrate 101 may be textured. In one embodiment, the front side surface 132 is textured with random pyramids using a wet etch process comprising potassium hydroxide and isopropyl alcohol. The textured surface helps increase solar radiation collection. The front side surface 132 may further include a stack of materials 133, which may comprise one or more layers of materials, such as anti-reflective coating, passivation layer, and so on. The texturing process and other processing on or under the front side surface 132 may be performed at any suitable step of the manufacturing process without detracting from the merits of the present invention.

The resulting solar cell, which is an all back contact solar cell in one embodiment, has a hybrid emitter design in that one polarity of emitters comprise doped polycrystalline silicon, while the other and opposite polarity of emitters comprise doped single crystalline silicon formed in a single crystalline silicon substrate. More particularly, in the example of FIG. 8, the emitter 103 comprises P-type doped polycrystalline silicon, while the emitters 108 comprise N-type doped single crystalline silicon and are formed in an N-type doped single crystalline silicon substrate. As can be appreciated, the polarity of the doping of the emitter 103, emitters 108, and the substrate 101 may be changed with appropriate changes to the doping of the other features. For example, in other embodiments, the single crystalline silicon substrate 101 may be P-type doped, the single crystalline silicon emitters 108 may be P-type doped, and the polycrystalline silicon emitter 103 may be N-type doped.

Generally speaking, in emitter designs where both the P-type and N-type doped emitters are in a single crystalline silicon substrate, the dopant concentration in the emitters must be balanced between high dopant concentration desired for low contact resistance and low dopant concentration desired for high minority carrier lifetimes. The conflicting demands of low contact resistance and high minority carrier lifetimes lead to suboptimal solar cell structures.

Solar cells where both the P-type and N-type doped emitters are formed in polycrystalline silicon eliminate the trade-off between low contact resistance and high minority carrier lifetimes. In particular, a dielectric separating the polycrystalline silicon emitters from the single crystalline silicon substrate screens out minority carriers, allowing for higher dopant concentration while maintaining relatively high minority carrier lifetimes. A main disadvantage is the need to create a trench between the P-type and N-type doped emitters in the polycrystalline silicon. The trench requires an additional patterning step and specific passivation on the backside surface of the solar cell, increasing the cost of manufacturing the solar cell.

The hybrid emitter design of the present disclosure provides many benefits heretofore unrealized, including higher dopant concentration, and thus lower contact resistance, for the polycrystalline silicon emitters 103. This is achieved without having to form trenches by providing single crystalline silicon emitters 108 in the single crystalline silicon substrate 101. The absence of trenches between emitters saves on patterning and associated process steps. And because only one polarity of polycrystalline silicon emitters is involved, the polycrystalline silicon emitters may be doped in situ. The solar cells of the present disclosure thus provide most of the advantages of all polycrystalline silicon emitters with lower manufacturing cost.

Figure 13:
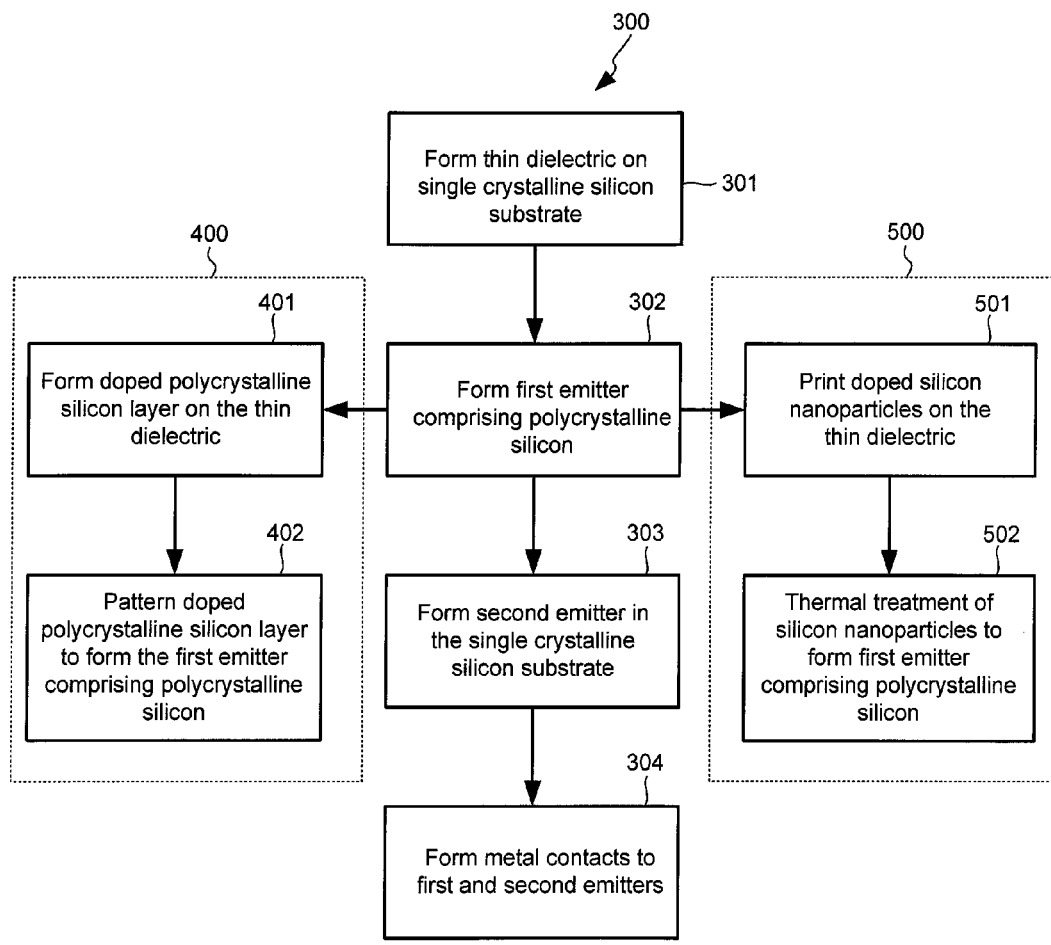
FIG. 13 shows a flow diagram of a method of manufacturing a solar cell in accordance with an embodiment of the present invention.

Referring now to FIG. 13, there is shown a flow diagram of a method 300 of manufacturing a solar cell in accordance with an embodiment of the present invention. In the example of FIG. 13, a thin dielectric layer is formed on a backside surface of a single crystalline silicon substrate (step 301). In one embodiment, the silicon substrate comprises a high lifetime single crystalline silicon wafer that is doped with N-type dopants. The thin dielectric layer may comprise silicon dioxide thermally grown directly on the backside surface of the single crystalline silicon substrate. A first emitter comprising doped polycrystalline silicon is formed on the thin dielectric layer (step 302). The first emitter may be polycrystalline silicon doped to have a first polarity. For example, the polycrystalline silicon may be doped with a P-type dopant.

The first emitter comprising polycrystalline silicon may be formed in accordance with a method 400 by forming a doped polycrystalline silicon layer on the thin dielectric layer (step 401) and thereafter patterning the doped polycrystalline silicon layer to form the first emitter (step 402). The first emitter comprising polycrystalline silicon may also be formed in accordance with a method 500 by printing doped silicon nanoparticles on the thin dielectric layer (step 501) and thereafter performing a heat treatment to coalesce the silicon nanoparticles to form polycrystalline silicon (step 502). The first emitter may be doped before or after formation on the thin dielectric layer.

A second emitter is formed in the single crystalline silicon substrate (step 303). In one embodiment, the second emitter is formed by forming a dopant source layer on the single crystalline silicon substrate, and thereafter diffusing dopants from the dopant source layer into the single crystalline silicon substrate to form the second emitter comprising single crystalline silicon. The second emitter may be doped to have a second polarity opposite to the first polarity of the polycrystalline silicon emitter. In the example where the polycrystalline silicon emitter is P-type doped, the single crystalline silicon emitter may be doped with N-type dopants, and the single crystalline silicon substrate may be doped with N-type dopants. In other examples where the polycrystalline silicon emitter is N-type doped, the single crystalline silicon emitter may be doped with P-type dopants, and the single crystalline silicon substrate may be doped with P-type dopants.

Interdigitated metal contacts are thereafter connected to the first and second emitters (step 304).

Hybrid emitter all back contact solar cells and methods of manufacturing same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of manufacturing an all back contact solar cell, the method comprising:
    forming a thin dielectric layer on a single crystalline silicon substrate;
    forming a first emitter of the solar cell on the thin dielectric layer, wherein the thin dielectric layer is between the single crystalline silicon substrate and the first emitter, the first emitter comprising polycrystalline silicon doped to have a first polarity; and
    forming a second emitter and a third emitter of the solar cell in the single crystalline silicon substrate, the second emitter and the third emitter comprising single crystalline silicon doped to have a second polarity opposite the first polarity, the first emitter being formed between the second and third emitters, the second and third emitters being formed starting from opposing ends of the first emitter.

2. The method of claim 1, further comprising:
    forming a first metal contact connected to the first emitter on a backside of the solar cell, the backside being opposite a front side of the solar cell that faces the sun during normal operation;
    forming a second metal contact connected to the second emitter on the backside of the solar cell; and
    forming a third metal contact connected to the third emitter on the backside of the solar cell.

3. The method of claim 1, wherein the thin dielectric layer comprises silicon dioxide and is formed directly on a surface of the single crystalline silicon substrate.

4. The method of claim 2, further comprising:
    forming a first layer of material on the first emitter and the backside surface of the single crystalline silicon substrate, wherein the first metal contact connects to the first emitter through the first layer of material but not through the thin dielectric layer.

5. The method of claim 4, wherein the second metal contact connects to the second emitter through the first layer of material and the thin dielectric layer.

6. The method of claim 1, wherein the first emitter is a P-type doped emitter, the second emitter is an N-type doped emitter, and the single crystalline silicon substrate is doped with an N-type dopant.

7. A method of manufacturing an all back contact a solar cell, the method comprising:

forming a thin dielectric layer on a single crystalline silicon substrate;

forming a first emitter of the solar cell on the thin dielectric layer, the first emitter comprising doped polycrystalline silicon having a first doping type;

forming a second emitter of the solar cell in the single crystalline silicon substrate, the second emitter comprising doped single crystalline silicon having a second doping type;

forming a third emitter of the solar cell in the single crystalline silicon substrate, the third emitter comprising doped single crystalline silicon having the second doping type, wherein the first emitter is formed between the second and third emitters, the second and third emitters are formed starting from opposing ends of the first emitter, and the thin dielectric layer is formed between the single crystalline silicon substrate and the first emitter; and wherein the first doping type is opposite to the second doping type.

8. The method of claim 7, wherein the first emitter is doped with P-type dopants, the second emitter is doped with N-type dopants, and the single crystalline silicon substrate is doped with N-type dopants.

9. The method of claim 7, wherein the thin dielectric layer comprises silicon dioxide.

10. The method of claim 7, further comprising:

forming a metal contact that is connected to the second emitter through a contact hole in the thin dielectric layer.

\* \* \* \* \*